(12) United States Patent
Sumi et al.

(10) Patent No.: US 6,668,025 B1
(45) Date of Patent: Dec. 23, 2003

(54) TUNING DEMODULATOR FOR DIGITALLY MODULATED RF SIGNALS

(75) Inventors: Shigeharu Sumi, Gifu (JP); Kenji Adachi, Aichi (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/236,419

(22) Filed: Jan. 25, 1999

(30) Foreign Application Priority Data

Jan. 23, 1998 (JP) ............................... 10-011094

(51) Int. Cl.[7] ..................... H04L 27/14; H04B 1/18
(52) U.S. Cl. ..................... 375/326; 455/180.3
(58) Field of Search ..................... 375/326, 344, 375/345, 376; 455/226.1, 67.1, 12.1, 180.3; 348/563, 564, 461

(56) References Cited

U.S. PATENT DOCUMENTS

| | | | |
|---|---|---|---|
| 5,428,837 A | | 6/1995 | Bayruns et al. ............. 455/317 |
| 5,457,817 A | * | 10/1995 | Nagai et al. ............. 455/180.3 |
| 5,533,070 A | | 7/1996 | Krishnamurthy et al. ... 375/346 |
| 5,668,701 A | | 9/1997 | Fukai ......................... 361/816 |
| 5,809,088 A | | 9/1998 | Han ............................ 375/344 |
| 5,901,184 A | * | 5/1999 | Ben-Efraim et al. ........ 348/731 |
| 6,445,907 B1 | * | 9/2002 | Middeke et al. ......... 455/226.1 |

FOREIGN PATENT DOCUMENTS

DE 3726181 3/1988
GB 2192104 12/1987

OTHER PUBLICATIONS

Kaltenecker et al.: "Internal Isolation Rings Improve VCO Performance", Motorola Technical Developments vol. 16, No. 8, Aug 1, 1992, pp. 70–71, XP000310358.
European Search Report, application No. 99300451.4, dated Oct. 19, 1999.
* cited by examiner

*Primary Examiner*—Khai Tran
(74) *Attorney, Agent, or Firm*—RatnerPrestia

(57) ABSTRACT

A tuning demodulator for digitally modulated signals tunes and detects a desired RF signal by an I/Q detection circuit and a tuning oscillation circuit composed of a PLL synthesizer having an output frequency close to the desired RF signal, and being provided with electrical or mechanical signal separating components to suppress the leaked output power from the tuning oscillation circuit. The signal separation components include an arrangement of circuits inside a metallic case, a metallic partition board, and an arrangement of power supply terminals. When the tuning demodulator detects a frequency error by a frequency error detection circuit, it adjusts a voltage-controlled reference oscillator that gives the PLL synthesizer an exact frequency reference, and hence it prevents deterioration of the bit error rate of the detected signals. Further, an error correction circuit can be added to compensate the fluctuations in characteristics of constituent parts.

18 Claims, 11 Drawing Sheets

TUNING DEMODULATOR FOR DIGITALLY MODULATED RF SIGNALS

BACKGROUND OF THE INVENTION

The present invention relates to a tuning demodulator for digitally modulated RF signals for detecting RF signals digitally modulated by television signals or the like.

A conventional tuning demodulator for digitally modulated RF signals for receiving and detecting RF signal digitally modulated by television signal or the like, for example, RF signal in 1–2 GHz band is as shown in FIG. 11, in which the RF signal entered from an RF signal input terminal 301 through a receiving antenna is amplified in an RF circuit 302, and enters a mixing circuit 303, and is mixed with an output signal of a local oscillation circuit 304 of which output frequency is in a same RF band as the RF signal, for changing the output frequency while keeping a specific frequency difference from the frequency of a desired receiving channel, and the station is selected by converting the frequency of the desired receiving channel to an IF signal, for example, a signal in 400 MHz band. Moreover, this IF signal is amplified in an IF circuit 306 (IF amplification), and passed through a band pass filter (IF BPF), and then it is put into an I/Q detection circuit 306 together with an output signal of a detection oscillator 307 of which output frequency is in IF band, and undergoes orthogonal demodulation (or quadrature demodulation) to be taken out from output terminals 308a, and 308b as so-called I signal and Q signal. (In this specification, I and Q signals are not color difference signals as defined in the NTSC system, but are modulation signals which modulate carriers differing in phase by 90°.) In this conventional apparatus, since the RF is once converted into an IF signal (hereinafter called down-converting method), if the oscillation signal of the local oscillation circuit 304 leaks from the RF input terminal 901, its frequency is apart from the RF signal by the portion of the IF frequency, and it has no interference on other receiving apparatus having the same receiving frequency band, but as known from FIG. 11, the mixing circuit and oscillation circuit are required by two pieces each, such as 303, 306, and 304, 307, and the tuning demodulator for digitally modulated RF signals itself is complicated, and there are problems in design and manufacture. It was accordingly proposed to simplify and downsize the apparatus by selecting the station and detecting simultaneously (hereinafter called direct detection method) by using an oscillation circuit for detection, without employing the down-converting method, of which output frequency is nearly same as the frequency of the desired receiving channel in the RF signal, but in this method, the problem was that the oscillation signal of the oscillation circuit for detection leaks from the RF input terminal to impede other receiving apparatus having the same receiving frequency band, and any prior art overcoming this problem was not known yet.

Incidentally, the output signal in the local oscillation circuit of down-converting method or oscillation circuit for detection in direct detection method in the case of receiving 12 GHz band satellite broadcast by using a consumer receiving system is generated accurately and stably by a PLL frequency synthesizer on the basis of the nominal frequency of broadcast, but in the 12 GHz band receiving antenna, since the frequency is not converted accurately and stably into 1–2 GHz band as in the PLL frequency synthesizer, the frequency of the RF input signal is slightly deviated usually from the nominal frequency to cause a frequency error. FIG. 12 shows a tuning demodulator for digitally modulated RF signals having a function of compensating for the frequency error by the direct detection method, which corresponds to the QPSK modulated RF signals. In this conventional apparatus, the output frequency (that is, the frequency of output signal) of an oscillation circuit for detection 404 is set by a PLL frequency synthesizer 404a so as to coincide with the nominal frequency of the input signal to be selected on the basis of the output frequency of a reference oscillator 408, but actually it remains fixed even if the RF signal has a frequency error, and there was a possibility of deterioration of bit error rate in a later stage. The output of the detection circuit 404 is put into A/D converters 409a and 409b through low pass filters 408a and 400b, and is converted into a digital signal by using a clock signal regenerated in a clock regenerating circuit 412. Afterwards, in a first complex multiplier 411, the frequency error is compensated by using the output signal of a frequency error detection circuit 414, and therefore deterioration of bit error rate is prevented. Further later, in order to avoid interference between signals, a clock signal and a carrier signal are regenerated in a second complex multiplier 416, together with the clock regeneration circuit 412 and carrier regeneration circuit 413, through roll-off filters 410a and 410b, while data is detected from its output signal in a data detection circuit 417, and clock signal and data signal are issued from output terminals 418a and 418b, respectively. Incidentally, all circuits enclosed by broken line 420 in FIG. 12 are integrated into an one-chip LSI. Such conventional apparatus, however, requires a circuit to compensate for frequency error, such as the complex multiplier 411, and the apparatus itself is complicated to cause problems in design and manufacture, and moreover in order to compensate for the frequency error by the complex multiplier 411 only, its operation bit number must be sufficiently large, which causes to deteriorate the bit error rate.

Thus, the conventional tuning demodulators for digitally modulated RF signals, whether in down-converting method or in direct detection method, were complicated in apparatus, increased in size, and raised in coat, and had problems in performance such as leek of interference radio wave and deterioration of bit error rate. The tuning demodulator for digitally modulated RF signals of the invention is not only simplified in apparatus, reduced in size, and lowered in cost, but also presents various benefits to contribute to reduction of leak of interference radio wave, improvement of bit error rate, and enhancement of station selection performance.

SUMMARY OF THE INVENTION

To solve the above problems, it is a first object of the invention to present a tuning demodulator for digitally modulated RF signals simplified in apparatus, reduced in size, and lowered in cost, by facilitating the means for suppressing leakage of oscillation signal of the oscillation circuit for detection from the RF input terminal, in the tuning demodulator for digitally modulated RF signals by direct detection method for selecting and detecting digitally modulated RF signals simultaneously, and it is a second object to present a tuning demodulator for digitally modulated RF signals simplified in apparatus, reduced in size, and lowered in cost, as well as improved in the bit error rate and enhanced in the station selecting performance, without requiring the hitherto needed complex multiplier for compensation of frequency error.

To achieve the first object, the invention is characterized by generating an unmodulated wave having a frequency nearly equal to the frequency of desired reception signal among RF signals digitally modulated to be put in an RF input signal, in an oscillation circuit for detection, selecting a station and detecting simultaneously by entering this output signal and the RF signal amplified through the input terminal and RF circuit into an I/Q detection circuit, issuing detected I and Q original signals, and suppressing leak of the oscillation signal of the oscillation circuit into the input terminal by radiation into path other than the intended signal path, that is, into the space, by disposing physical and/or electrical signal separating means between the RF circuit and the oscillation circuit (hereinafter, in the invention, "physical" refers to a visible position in a circuit in spatial, planar or linear term, as being distinguished from "electrical").

In one aspect of the invention, the I/Q detection circuit in the signal separating means, and by disposing physically the RF circuit and input terminal on one side and the oscillation circuit on other side of the I/Q detection circuit so as to separate the both circuits physically, the strength of the electric field for the oscillation signal of the oscillation circuit invading into the RF circuit by radiating into the space is reduced, so that leak of the oscillation output signal into the input terminal is suppressed. Moreover, by forming a flat section of a metallic casing for accommodating these circuits in a nearly square form, the RF circuit, I/Q detection circuit, and oscillation circuit are physically disposed closely to one side thereof in this sequence, and therefore the side of the casing acts as a grounding surface close to each circuit, the output impedance of the oscillation circuit is prevented from being higher parasitically, radiation of the output signal of the oscillation circuit into the space is suppressed, and the leak from the input terminal through the RF circuit can be prevented. Further, since the leak of the output signal of the oscillation circuit can occur also through an direct-current power source supplied in each circuit, and by disposing at least the power source terminal of the RF circuit and the power source terminal of the oscillation circuit separately, it is possible to prevent the problem of leak .of the signal of the oscillation circuit from the input terminal by invading into the RF circuit through the lead wire for supplying the direct-current power source.

In other aspect of the invention, in the casing, by disposing a metal partition board physically between the RF circuit and the oscillation circuit, the apace between the two circuits can be cut oft and invasion of the oscillation signal of the oscillation circuit into the RF circuit by radiating into the space can be prevented, and the leak of the oscillation signal of the oscillation circuit from the input terminal through the RF circuit can be suppressed.

In a different aspect of the invention, a print pattern of the RF circuit is formed on one side of a multilayer printed circuit board having a ground plane in the intermediate layer, and a print pattern of the oscillation circuit is formed on other side, and the ground plane is shared, and therefore if the oscillation signal of the oscillation circuit radiate& into the apace, the ground plane acts as an electric shielding board to prevent invasion into the RF circuit, so that leak into the input terminal can be suppressed.

In a further aspect of the invention, the plane region of the single-layer printed circuit board is divided into two, and the RF circuit is provided on the surface of one region, and the oscillation circuit is provided on the back side of other region, and a plurality of through-holes are provided for electrically shorting between the grounding surface of the print patterns of the RF circuit and oscillation circuit, and therefore if the grounding surfaces are electrically separated, it is possible to prevent the trouble of the output impedance of the oscillation circuit becoming parasitically high and radiating into the space, that is, the electric (high frequency) separation of the two circuits is increased, and leak of the oscillation signal of the oscillation circuit from the input terminal can be suppressed.

In a further different aspect of the invention, by disposing a low pane filter for suppressing the oscillation output signal of the oscillation circuit between the oscillation circuit and the terminal for feeding direct-current power source thereto, leak of the signal of the oscillation signal from the input terminal through the RF circuit can be suppressed.

To achieve the second object of the invention, I and Q original signals obtained by input of an RF signal having a frequency error to be entered in an RF input terminal as in the case of receiving 12 GHz band satellite broadcast into an I/Q detection circuit together with the output signal of an oscillation circuit for detection composed of a PLL frequency synthesizer having a voltage control crystal oscillator (VCXO) as reference oscillation signal source are processed by low pass filter. A/D converter, roll-off filter and complex multiplier, a digital output signal value corresponding to the magnitude of the frequency error is generated by a frequency error detection circuit, and an output signal obtained by passing through a D/A converter is used as control voltage of the reference oscillation signal source to control the output frequency in the direction of compensating for the frequency error, so that the frequency error is compensated by establishing the synchronism of a phase lock loop in the PLL frequency synthesizer. In the invention, since the output frequency of the reference oscillator is controlled by the output signal of the frequency error detection circuit, the frequency error is compensated in the I/Q detection circuit, and therefore a favorable bit error rate is obtained, and the conventional complex multiplier with a large number of operation bits to compensate for the frequency error is not needed, so that the apparatus may be simplified in structure, reduced in size, and lowered in cost. Moreover, the demodulated digital signal obtained from the data detection circuit consecutive to the complex multiplier is taken outside from two output terminals, and clock signal and carrier signal necessary for the above signal processing are extracted and regenerated from the I and Q signals obtained in the I/Q detection circuit by the clock regeneration circuit and carrier regeneration circuit together with the complex multiplier.

In one aspect of the invention, the reference oscillation signal is generated from the clock signal regenerated in the clock regeneration circuit and the output signal of the error detection circuit, and a favorable bit error rate is obtained in a simple constitution, not particularly requiring reference oscillator.

In other aspect of the invention, if the frequency error of the frequency of the input signal into the input terminal is larger than a predetermined value f and the synchronism of the apparatus is not established, the output signal value of the frequency error detection circuit is sequentially changed and issued until the synchronism is established at the interval $\Delta v$ corresponding to the value $\Delta f$ and the control voltage of the reference signal oscillator is changed sequentially, that is the operation for searching the output frequency of the oscillation circuit for detection completely is repeated until the synchronism is established, so that accurate station selection is achieved. Besides, since the relation between the output frequency of the oscillation circuit for detection and the control voltage of the reference oscillator differs depending on the frequency of the input signal, if the frequency range of the input signal differs in a wide range, by designing to change and issue the output signal value preliminarily according to the station selection frequency, the station selection is enhanced in speed. Moreover, if the frequency error of the input signal is over the output frequency variable range of the oscillation circuit for detection corresponding to the frequency variable range of the reference oscillation signal, by changing the output signal value and changing the counter values of the PLL synthesizer, the output frequency of the oscillation circuit for detection can be changed, so as to be applicable to a larger frequency error of the input signal.

In a different aspect of the invention, a frequency error correction circuit having a function of reading the frequency of the reference oscillation circuit and generating an output signal for correcting it may be also provided, and it is possible to cope with if the frequency to control voltage characteristic of the reference oscillator is out of the standard deviation, and therefore the precision of the reference oscillator is not required to be too high. Besides, the output signal value of the error detection circuit can be also corrected by using the output signal of the error correction circuit, an accurate frequency error correction is realized. Still more, by using the output signal of the error correction circuit, the output frequency of the oscillation circuit for detection can be changed by varying the counter values of the PLL frequency synthesizer, so that a large frequency error can be also corrected.

The invention processes RF input signal digitally modulated in the above constitution by physical and/or electrical signal separating means disposed between an RF circuit and an oscillation circuit for detection, in a direct detection method not depending on down-converting method, and therefore prevents impedance on the other receiving apparatus by suppressing leak of oscillation signal of the oscillation circuit from the RF input terminal. Moreover, it also comprises means for obtaining the frequency error of the RF input signal as output signal value of frequency error detection circuit, and controlling the output frequency of the oscillation circuit for detection by it to compensate for the frequency error, and therefore the conventional complex multiplier for frequency error compensation is not needed, and since this complex multiplier was a cause of deterioration of bit error rate, the bit error rate can be improved, and various station selecting performances are enhanced. In addition, anyway, the apparatus is simplified, reduced in size and lowered in cost.

BRIEF DESCRIPTION OF THE DRAWINGS

FIG. 8(*b*) is diagram showing the relation between control voltage of a reference oscillator and frequency variable range of an oscillator for detection in the tuning demodulator for digitally modulated RF signals in embodiment 8 and 7 of the invention.

FIG. 10(*b*) is diagram showing the relation between control voltage of a reference oscillator and frequency variable range of an oscillator for detection in the tuning demodulator for digitally modulated RF signals in embodiment 8 of the invention.

DESCRIPTION OF THE PREFERRED EMBODIMENTS

Figure 1:
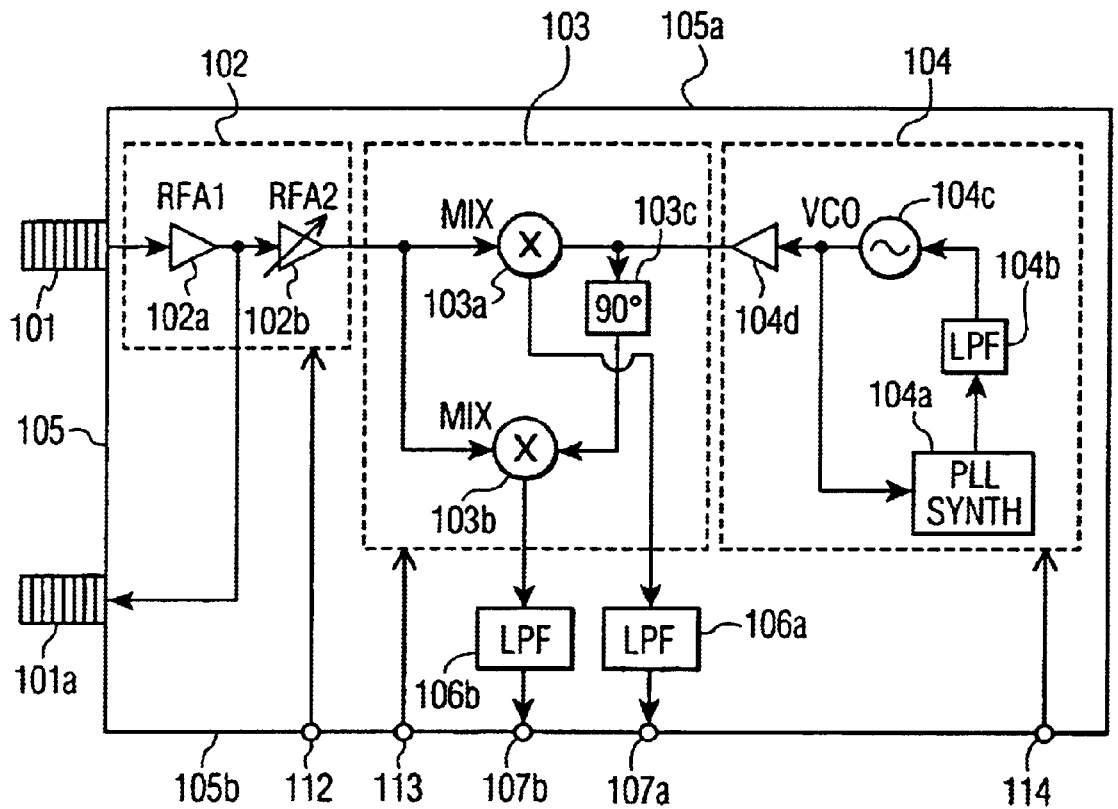
FIG. 1 is a block diagram of a tuning demodulator for digitally modulated RF signals in embodiment 1 of the invention.

Referring now to the drawings, preferred embodiments of the invention are described in detail below.

Embodiment 1

FIG. 1 is a block diagram of a tuning demodulator for digitally modulated RF signals in embodiment 1 of the invention, showing a tuner/demodulator section used in consumer-use STB (set top box) for receiving 12 GHz band satellite broadcast. In FIG. 1, from an RF input terminal 101 attached to one longitudinal aide 105*a* of a metallic casing 105, a digitally modulated RF signal in a frequency band of 1–2 GHz (precisely 950–2150 MHz) in entered. This signal is entered in the terminal 101 as the satellite broadcast wave in 12 GHz band is down-converted into the radio frequency (RF) by a receiving antenna, and transmitted to the indoor STB through a coaxial cable, and its signal electric power level is in a range of about −70 to −20 dBm. This signal, in an RF circuit 102 directly coupled to the terminal 101, is first amplified in an RF amplifier 102*a*, and is amplified up to a specific signal electric power level in a successive RF amplifier 102*b* with a automatic gain control (AGC) function, and is put into an I/Q detection circuit 103. Incidentally, the output signal of the amplifier 102*a* is partly issued also to an RF output terminal 101*a* so as to be connected to other STB in cascade. An oscillation circuit for detection 104 is a so-called PLL frequency synthesizer, but in FIG. 1, for the convenience of description, a pro-scaler, a phase comparator, various counters, and reference oscillator are expressed by one block as a PLL synthesizer 104*a*, and a total of four blocks are shown, together with other three blocks, that is, a low pass filter (also called loop filter) 104*b*, a VCO (voltage control oscillator) 104*c*, and a buffer amplifier 104*d*. (In this specification, this oscillation circuit for detection is. divided into three or four blocks for the oaks of convenience. For example, the reference oscillator is provided as an independent block, or the buffer amplifier is included in the PLL synthesizer, but since they are illustrated, confusion will not occur.) Based upon the receiving channel desired by the user among the incoming IF signals, a signal necessary for station selection is sent by the microcontroller in the STB into this apparatus, and an unmodulated RF wave coinciding with the center frequency of the receiving channel is generated in this oscillation circuit 104, and is put into the detection circuit 103. The amplifier 104d is provided so that the, VCO 104c may not be unstable due to effect of the detection circuit 103 which is its load circuit, and that the own oscillation output signal may not be reflected to have adverse effects on the oscillation circuit 104 including itself. In this way, the RF input signal and RF oscillation output signal entered in the detection circuit 103 are divided into two equal portions each, and the RF oscillation output signal is shifted in phase by 90°by a phase shifter 103c according to the principle of the I/Q detection, and is put into the mixers 103a and 103b, and I and Q signals are detected. As a result, as output signals of the mixers 103a and 103b, I and Q signals are obtained as untreated baseband original signals, and in order to remove extra higher harmonic components generated at the time of detection, a cut-off frequency is issued from detection output terminals 107a and 107b through 30 MHz low pass filters 106a and 106b. In this constitution, first of all, since the mixers 103a, 103b are balanced mixers, the output signal of the oscillation circuit 104 can suppress flow-out of the RF signal of the balanced mixers 103a, 103b from the input port by about 20 dB, and the I/Q detection circuit 103 itself acts as electric signal separating means, but if suppressed by such extent, the oscillation signal of the oscillation circuit 104 radiates into the space and invades into the RF circuit, and bones the problems of the invention cannot be solved in such manner. Therefore, across the I/Q detection circuit, by disposing the RF circuit and input terminal at one side and the oscillation circuit on the other side physically to separate the both circuits by a physical distance, the strength of the electric field in which the oscillation signal of the oscillation circuit radiates into the space to invade into the RF circuit is decreased, and leak of the oscillation output signal into the input terminal can be suppressed, so that the problems can be solved.

Moreover, by disposing the RF circuit 102, detection circuit 103 and oscillation circuit 104 closely to one side 106a of the metallic casing lob in a nearly square plans section for accommodating the above circuits, physically in this order, the casing aide 106a acts as a grounding surface close to each circuit, and the output impedance of the oscillation circuit 104 is prevented from being higher parasitically, and radiation of oscillation signal of the oscillation circuit 104 into the space is also suppressed, and thereby leak from the input terminal 101 through the RF circuit 102 can be suppressed.

Power source terminals to individual circuits are provided individually as terminals 112, 113, 114 for supplying direct-current power source to the circuits 102, 103, 104, which is effective to prevent the trouble of the oscillation signal of the oscillation circuit 104 leaking into the input terminal 101 through the RF circuit 102 through the power source leads connecting the circuits if they are common. These power source terminals are, in order to prevent invasion of the oscillation signal, provided at the side 105b opposite to the side 105a of the oscillation circuit 104 in order to extend the physical distance from the oscillation circuit 104.
Embodiment 2

Figure 2:
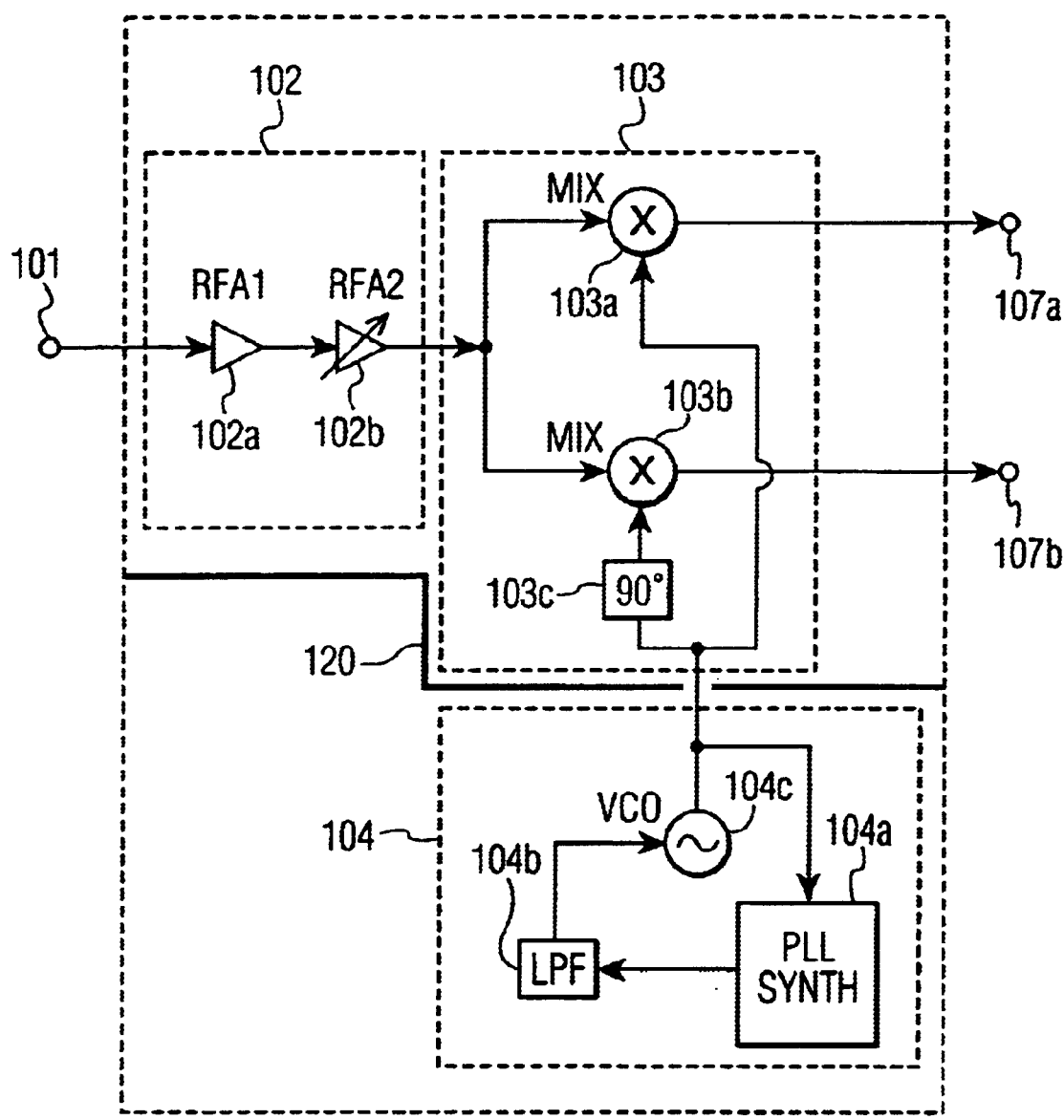
FIG. 2 is a block diagram of a tuning demodulator for digitally modulated RF signals in embodiment 2 of the invention.

FIG. 2 is a block diagram of a tuning demodulator for digitally modulated RF signals in embodiment 2 of the invention. In FIG.2, a metallic partition board 120 is positioned between the RF circuit 102 and oscillation circuit for detection 104 on the printed circuit board for composing the apparatus, and is physically disposed in the grounding portion of the print patterns of the both circuits, and therefore it acts as the grounding surface of the two circuits and also offers an electric shielding effect. Therefore, by this partition board 120, the portion of the oscillation signal of the oscillation circuit 104 radiating into the space is cut off by this partition board 120, and does not leak to the RF circuit 102 side, so that leak into the input terminal 101 directly coupled to the RF circuit 102 can be also suppressed. Moreover, since the two circuits are electrically shielded, the physical distance of the two circuits can be shortened, and the apparatus can be reduced in size, and the degree of freedom in design is increased.
Embodiment 3

Figure 3:
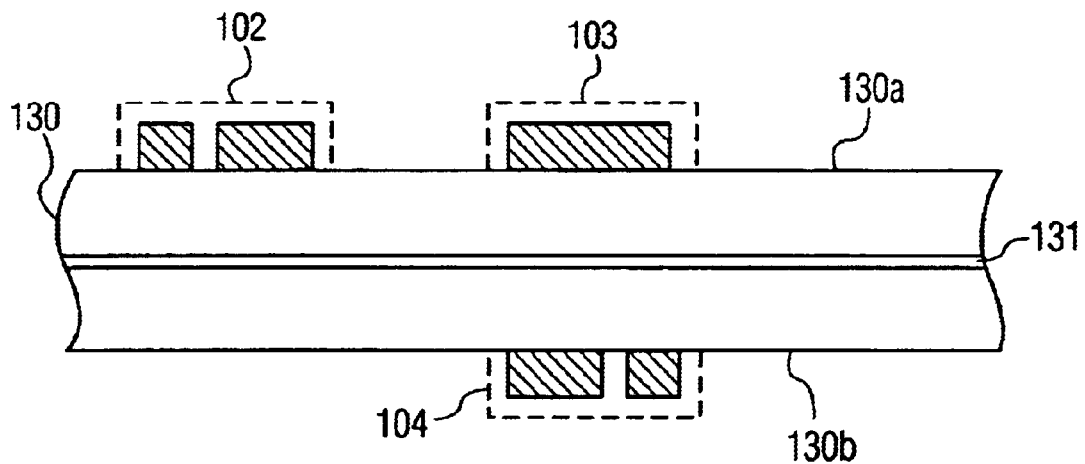
FIG. 3 is an essential sectional diagram of a tuning demodulator for digitally modulated RF signals in embodiment 3 of the invention.

FIG. 3 in an essential sectional diagram of a tuning demodulator for digitally modulated signals in embodiment 3 of the invention. In FIG. 3, a printed circuit board 130 is a multilayer printed circuit board having a ground plane 131 in the intermediate layer, and at one side 130a thereof, print pattern and circuit parts of the RF circuit 102 are formed and mounted, and at other side 130b, print pattern and circuit parts of the oscillation circuit for detection 104 are formed and mounted. By thus sharing the ground plane 131, the degree of electrical (high frequency) separation between the two circuits can be extended, and if the oscillation signal of the oscillation circuit 104 radiates into the space, the ground plane 131 act as an electric shielding board to prevent invasion into the RF circuit 102, thereby pressing leak into the input terminal 101. Moreover, since the multilayer printed circuit board is used as the printed circuit board, the size of the apparatus can be reduced, and the degree of freedom of design is increased.
Embodiment 4

Figure 4:
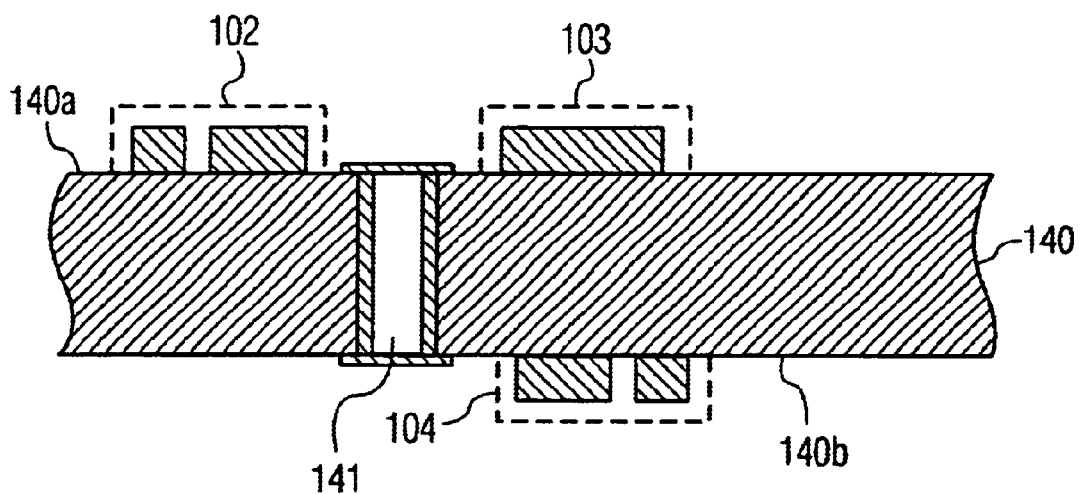
FIG. 4 is an essential sectional diagram of a tuning demodulator for digitally modulated RF signals in embodiment 4 of the invention.

FIG. 4 is an essential sectional diagram of a tuning demodulator for digitally modulated signals in embodiment 4 of the invention. A plane region of a single-layer printed circuit board 140 is divided into two sections, and the RF circuit 102 is provided on the surface 140a of one region, and the oscillation circuit for detection 104 is provided on the back side 140b of the other region, and further a plurality of through-holes 141 for electrically shorting between the grounding surfaces of the print patterns of the RF circuit 102 and oscillation circuit for detection 103 are provided, and therefore if the grounding surfaces are electrically separated, it is effective to prevent the trouble of the output impedance of the oscillation circuit 104 becoming parasitically high to radiate into the space, that in, the degree of electrical (high frequency) separation of the two circuits can be increased, and leak of the oscillation signal of the oscillation circuit 104 from the input terminal 101 through the RF circuit 102 can be suppressed.
Embodiment 5

Figure 5:
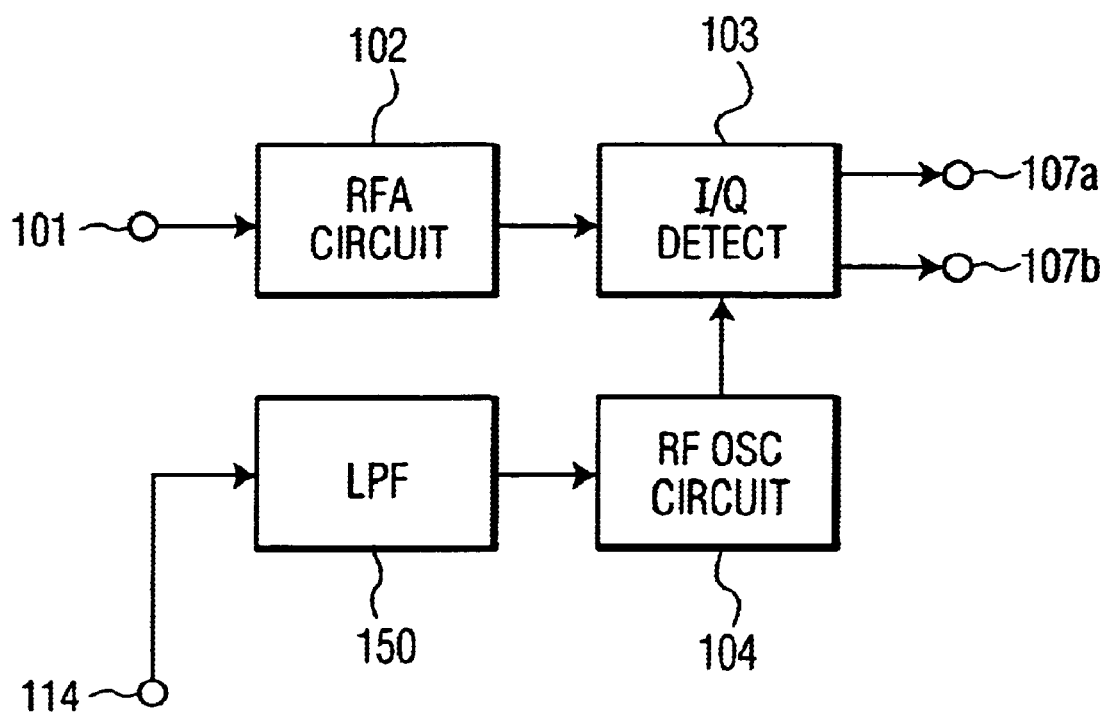
FIG. 5 is a block diagram of a tuning demodulator for digitally modulated RF signals in embodiment 3 of the invention.
Figure 6:
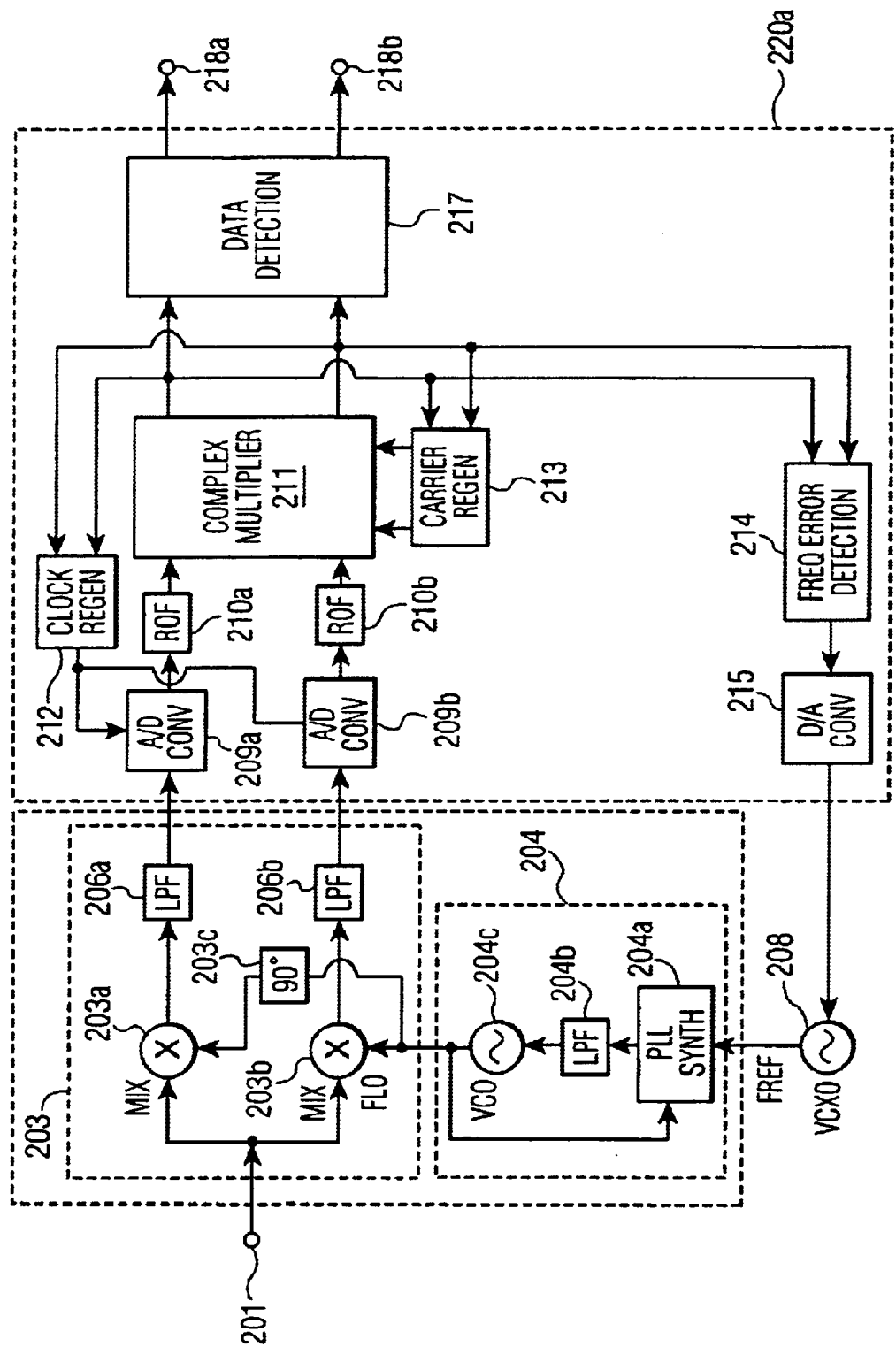
FIG. 6 is a block diagram of a tuning demodulator for digitally modulated RF signals in embodiment 6 of the invention.

FIG. 6 is a block diagram of a tuning demodulator for digitally modulated signals in embodiment 5 of the invention. In FIG. 5, a low pass filter 150 for cutting off the output signal of the oscillation circuit 104 is connected between the oscillation circuit 104 and direct-current power source supply terminal 104, and therefore invasion of the output signal of the oscillation circuit 104 into the RF circuit 102 through the direct-current power source can be prevented, and finally least into the input terminal 101 through the RF circuit 102 can be suppressed.
Embodiment 6

FIG. 6 is a block diagram of a tuning demodulator for digitally modulated signals in embodiment 6 of the invention, which is used in the STB for 12 GHz band satellite broadcast reception. The process of signal processing from input of AF input signal into RF input terminal 201 until its output as baseband signal through low pass filters 206a and 206b after I/Q detection is same as in embodiment 1 and in hence omitted. In FIG. 6, however, the signal separating means, buffer amplifier and power source terminals are omitted, and a reference oscillator 208 is separate from a PLL synthesizer 204a. The reference oscillator 206 is usually a voltage control crystal oscillator (VCXO), and an oscillation circuit 204, as mentioned later, produces original signals of output signals of the oscillation circuit for detection generated by PLL synthesizer 204a. low pass filter 204b, and VCO (voltage control oscillator) 204c. The baseband original signal is put into A/D converters 209a and 209b together with a clock signal regenerated in a clock regeneration circuit 212, and converted into a digital signal, and the band is limited in roll-off filters 210a, and 210b for suppressing deterioration of bit error rate by suppressing interference between signals due to noise or the like. Since the output signals of these filters 210a and 210b contain, aside from the desired digital signal, a differential frequency component between the RF input signal and the output signal of the oscillation circuit 204, and therefore by putting them into a complex multiplier 211, and a phase lock loop is formed by this multiplier 211 and a carrier regeneration circuit 213, and a stable carrier signal (carrier of RF input signal) is extracted and regenerated. The clock signal is also extracted and regenerated in a clock signal regenerating circuit 212 by using the output signal of this multiplier 211. The output signal of the multiplier 211 is put into a data detection circuit 217, and is issued as a desired digital signal from digital output terminals 218a and 218b as clock signal and coded data raw, respectively. On the other hand, an error detection circuit 214 generates and produces a digital output signal value corresponding to the frequency error from the output signal of the multiplier 211, and this output signal value is converted into an analog signal by a D/A converter 215, and is fed back as control voltage of the reference oscillator 208, and the output frequency of the reference oscillator 208 is changed in a direction of decreasing the frequency error, and finally the synchronism is established, mad the frequency error is compensated. Hereinafter, a numerical specific example is described. Supposing the output frequency of the reference oscillator 208 to be $F_{REF}$, the dividing ratios of program counter, swallow counter and reference counter of the PLL synthesizer 204a to be respectively N, A, R (all positive integers, N>A), and the dividing ratio of the pre-staler to be 64, the output frequency $F_{LO}$ of the oscillation circuit for detection 204 is expressed in the following formula (1).

$$F_{LO}=(N\times64+A)\times F_{REF}/R \quad (1)$$

Suppose $F_{REF}$ to be 4.0 MHz and the frequency of input frequency to be 950 MHz, coinciding with the nominal frequency, that is, in the absence of frequency error, by setting the counter values combination (N, A, R) as (59, 24, 16), $F_{LO}$ is 950 MHz, and hence this tuning demodulator is synchronized. When the frequency of the RF input signal is raised by +1 MHz to be 951 MHz, the error detection circuit 214 detects the increment of frequency, and controls the frequency of the reference oscillator 208 as expressed in formula (2) through the D/A converter 215, and therefore $F_{LO}$ becomes 951 MHz, and this tuning demodulator is synchronized while the values of N, A, R are fixed at the previous values.

$$F_{REF}=4.0042105 \text{ MHz} \quad (2)$$

Figure 12:
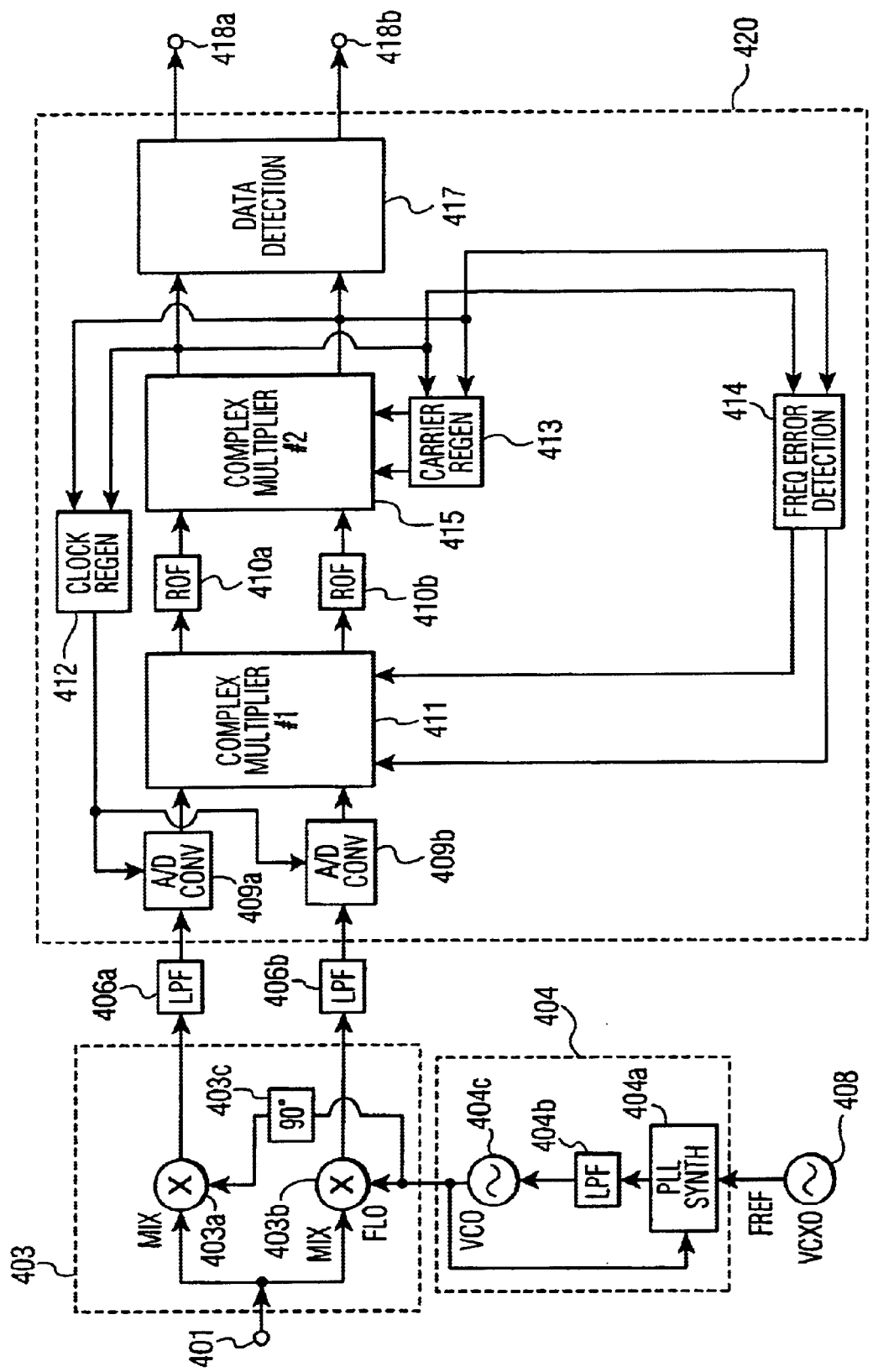
FIG. 12 is a block diagram of a tuning demodulator for digitally modulated RF signals in other prior art.

That is, the frequency error is compensated, and the hitherto required complex multiplier 411 for frequency error compensation in FIG. 12 is not necessary. As a result, the tuning demodulator for digitally modulated signals having an excellent bit error rate characteristic without using the conventional complex multiplier 411 is realized, and since this complex multiplier is not necessary, it is further simplified in structure, reduced in size, and lowered in cost.

Embodiment 7

Figure 7:
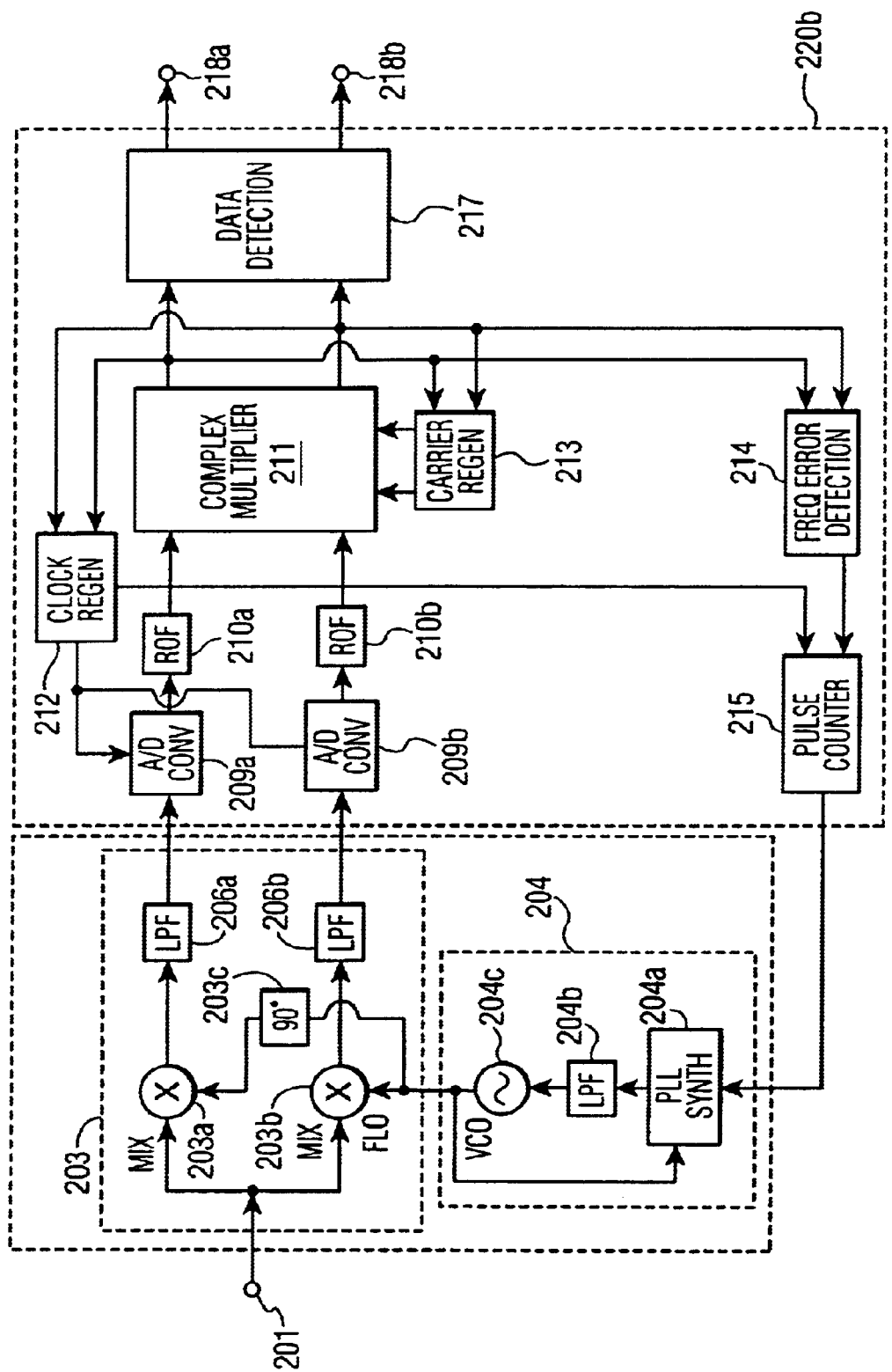
FIG. 7 is a block diagram of a tuning demodulator for digitally modulated RF signals in embodiment 7 of the invention.

FIG. 7 is a block diagram of a tuning demodulator for digitally modulated signals in embodiment 7 of the invention, and what differs from embodiment 6 is that a pulse counter 216 is provided instead of the reference oscillator 209 and D/A converter 215. The counter 216 generates an original signal of reference oscillation signal on the basis of clock signal as its output signal, and shifts the original signal by a necessary frequency by the output signal of an error detection circuit 214, and it has the substitute functions of both reference oscillator 208 and D/A converter 215 in embodiment 6. When the frequency of the output signal of the counter 216 as the reference oscillation signal is 4.0 MHz, and the center frequency of RF input signal is 950 MHz, the counter values N, A, R of the PLL synthesizer 204a are same values as in embodiment 6, and when the RF input signal increases by +1 MHz to be 951 MHz, the error detection circuit 214 detects the increment of the frequency, and controls to raise the generated frequency, of the counter 216 by the corresponding portion, so that the frequency becomes as expressed in formula (2), so that the synchronism of the tuning demodulator is established. Therefore, in this embodiment, too, while the values of N, A, R are fixed, by controlling only the portion of the generated frequency of the counter 216, the frequency error of the RF input signal can be compensated, and the tuning demodulator for digitally modulated signals having an excellent bit error rate characteristic without using the hitherto required complex multiplier 411 for frequency error compensation is realized, and since this complex multiplier, reference oscillator 208 and D/A converter 215 are not necessary, it is further simplified in structure, reduced in size, and lowered in cost.

Figure 8A:
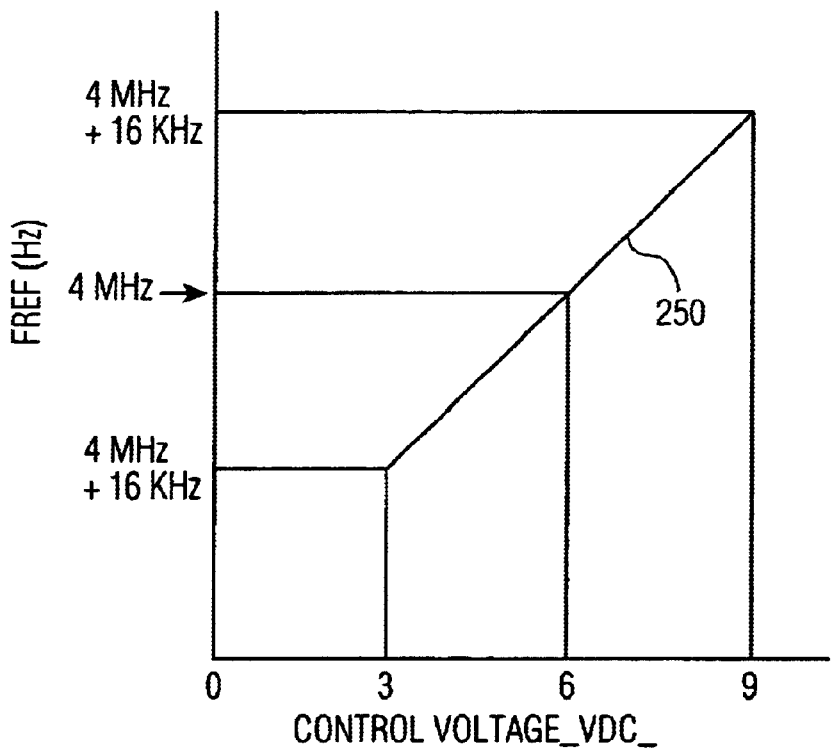
FIG. 8(*a*) is diagram showing the relation between control voltage of a reference oscillator and output frequency in the tuning. demodulator for digitally modulated RF signals in embodiments 6 and 7 of the invention.

FIGS. 8(a) and (b) are diagrams showing the relation between the output frequency of the reference oscillator and output frequency of oscillation circuit for detection 204, with respect to the control voltage of the reference oscillator 208 in embodiment 6, and in the apparatus in embodiment 6 and embodiment 7, this is to explain how the synchronizing action is done if the frequency of RF input signal is largely deviated, that is, in which process the output signal value of the frequency error detection circuit 214 or the counter values of the PLL synthesizer 204a is changed; by referring to specific numerical values. In embodiment 7, however, since the reference oscillator 208 in embodiment 6 is not used, in the following explanation, the control voltage of the axis of abscissas may be read as the output signal of the error detection circuit 214 (to be precise, the output signal of the D/A converter), so that the explanation about embodiment 6 is applied also to embodiment 7. In FIG. 8(a), line 250 indicates an example of relation between control voltage of the reference oscillator 208 and output frequency in FIG. 6, and broken line 270 and solid line 260 in FIG. 8(b) indicate the relation of the control voltage and variable range of output frequency of the oscillation circuit 204, respectively, at input signal frequency of 960 MHz and 2150 MHz. In FIG. 8(a), when the control voltage of the reference oscillator 208 is 6±3 V DC, its output frequency is 4.0 MHz±16 kHz, and in order that the center frequency 4.0 MHz may correspond to the output frequency 950 MHz of the oscillation circuit 204, the counter values combination (N, A, R) of the PLL synthesizer 204a may be set at (59, 24, 16). In this case, according to formula (1), the variable range of the output frequency of the oscillation circuit 204 is 950±3.8 MHz, as indicated by broken line 270 in FIG. 8(b). Similarly, in the case of 2150 MHz, by setting the counter values combination (N, A, R) as (134, 24, 16), the variable range is 2150±8.6 MHz, as indicated by solid line 260 in FIG. 8(b). When receiving a satellite broadcast in 12 GHz band, the frequency of the RF signal entered in the STB may be largely deviated from the nominal frequency, for example, by 5 MHz, but an ordinary consumer appliance is demanded to receive even in such a case. However, the frequency range Δf capable of detecting the frequency error by the error detection circuit 214 varies with the digital modulation system, and in the case of QPSK or 8PSK, for example, supposing the symbol rate of reception signal to be $f_s$ (Mbps); the range is known as follows.

| | | | |
|---|---|---|---|
| Δf = ± fs/8 | (MHz) | for QPSK | (3) |
| Δf = ± fs/16 | (MHz) | for 8PSK | (4) |

Figure 8B:
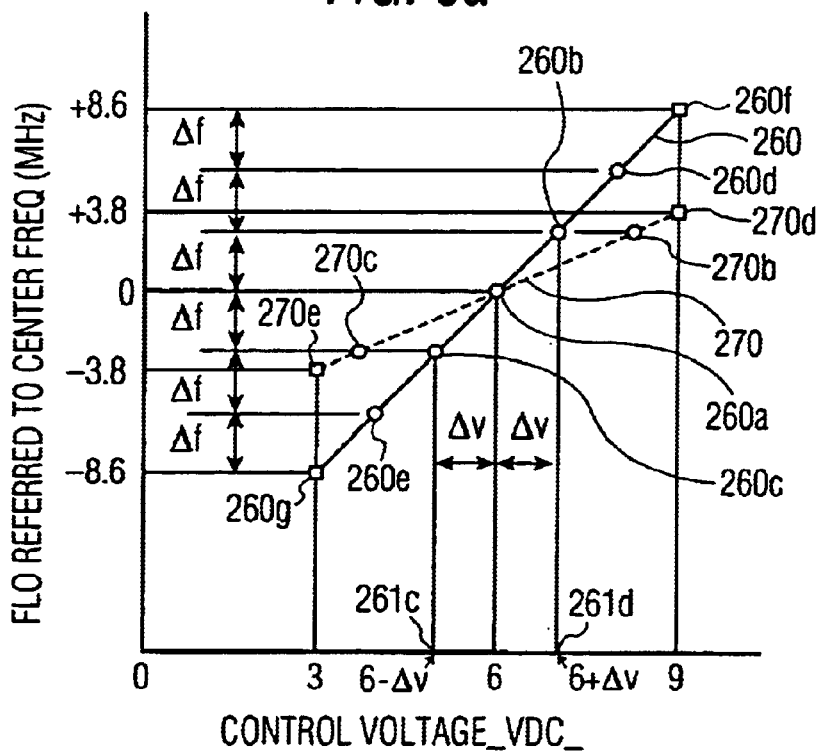

For example, when the modulation system is QPSK, and the nominal frequency of the selected RF reception signal $F_{RF}$ is 2150 MHz, with an unknown frequency error, the STB first sets the control voltage at 6 V DC, and sets the output frequency $F_{LO}$ of the oscillation circuit 204 at 2150 MHz. That is, in FIG. 8(b), the synchronizing action is started from the central point 260a on the solid line 280. If the reception frequency is not within ±Δf from point 260a and the synchronism is not established, the STB consequently changes the output signal value of the error detection circuit 214 and issues, and transmits it to the reference oscillator 208 through the D/A converter, and operates to synchronize again by changing the control voltage to the control voltage (6+Δv) VDC corresponding to point 260b shifting $F_{LO}$ by +Δf from 6 VDC corresponding to point 260a. Yet, if the reception frequency is not within ±Δf from point 260b and the synchronism is not established, the output signal value is changed and issued, and this time the control voltage in set to a control voltage (6−Δv) VDC corresponding to point 260c shifting $F_{10}$ by −Δf in the reverse direction of the case above from point 260a, and the synchronizing action is repeated. Even after that, if the RF reception frequency is not within ±Δf from point 260c and the synchronism is not established, similar operation is repeated until the synchronism is established in the sequence of point 260d and point 260e. If the synchronism is not established yet at point 260x, it means RF reception frequency does not exist between the upper limit and lower limit on solid line 260 in FIG. 8(b), and this time the counter values of the PLL synthesizer 204a is changed, and it is set again so that the output frequency $F_{LO}$ of the oscillation circuit 204 may be at point 260f shifted by +8.6 MHz from point 260a, that is, 2150+8.6 MHz, and the output signal value of the error detection circuit 214 is set again and issued, that is, the control voltage is set again to the initial value, and the synchronizing operation is effected. If the synchronism is not established yet, the output frequency $F_{LO}$ of the oscillation circuit 204 is set to point 260a shifted by 46 MHz from point 260a, where similar operation is repeated. In this procedure, the synchronous point is finally reached, and the frequency exceeding the upper limit or lower limit of solid line 260 in FIG. 8(b) can be also synchronized. In the case the nominal frequency of the reception signal $F_{RF}$ is 960 MHz, similarly, starting from point 260a, the synchronizing operation is done in the sequence of point 270b, point 270c, point 270d, and point 270e, and when the synchronism is not established at point 270e, the subsequent operation is the same. Thus, by changing sequentially and is-suing the output signal value of the error detection circuit 214 so as to scan the control voltage of the reference oscillator completely at interval of Δv, the synchronous point is achieved securely and the station can be selected accurately. The scanning interval Δv of the control voltage depends, as known from solid line 260 and broken line 270 in FIG. 8(b), on the output frequency $F_{LO}$ of the oscillation circuit 204, that is, the reception frequency $F_{RF}$ (Δv shown in FIG. 8(b) is when $F_{RF}$ is 2160 MHz, and it is larger in the case of 950 MHz, and finally Δv is a function of $F_{RF}$ of $F_{LO}$), and therefore by varying the Δv at every reception frequency, when the output signal value is changed and issued, the synchronous point is reached in a shorter time, and the counter values of the PLL synthesizer 204a is changed, as well as the output signal value of the error detection circuit 214, so that it is possible to cope with a larger frequency error.

Embodiment 8

Figure 9:
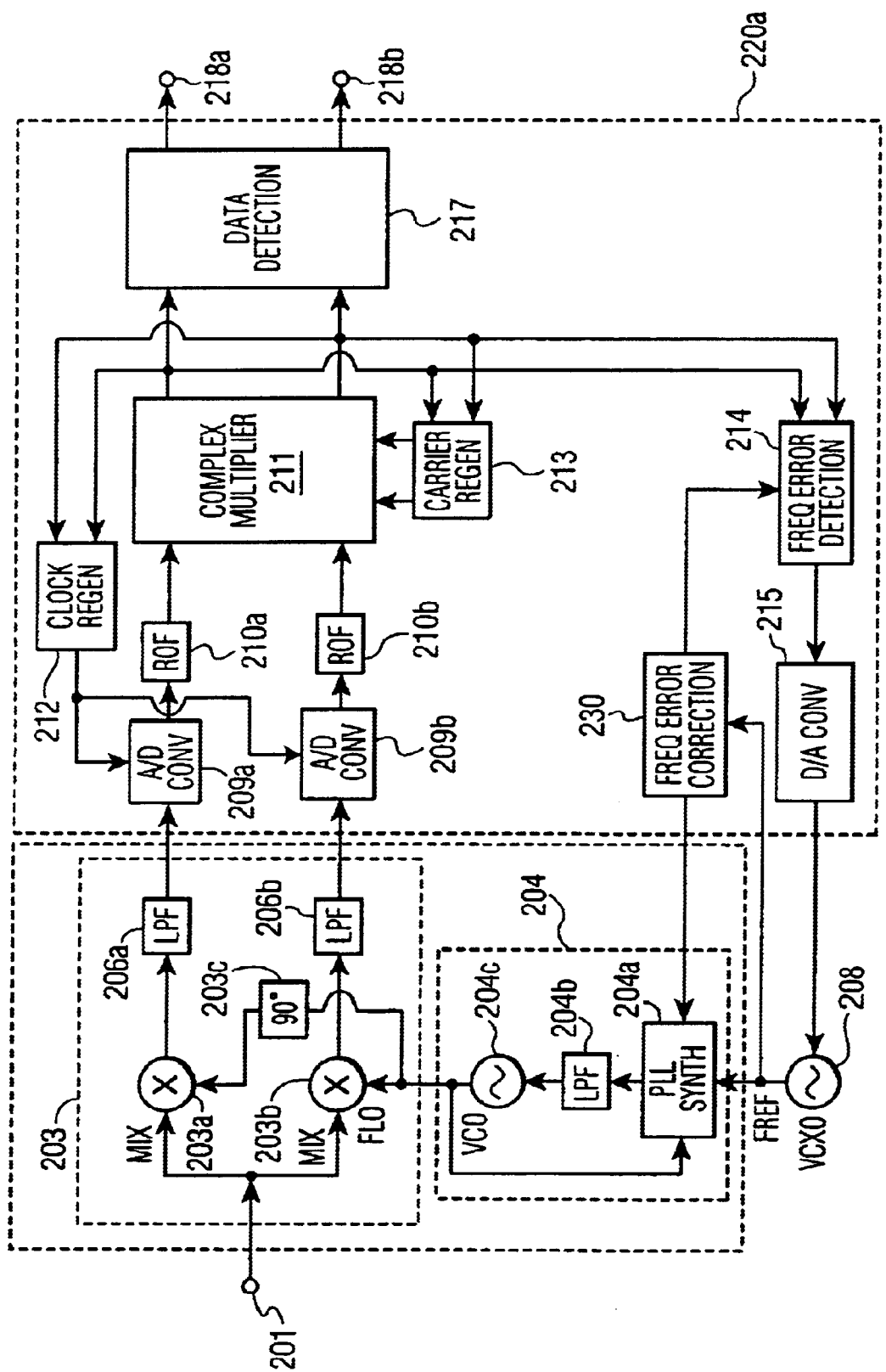
FIG. 9 is a block diagram of a tuning demodulator for digitally modulated RF signals in embodiment 8 of the invention.
Figure 10A:
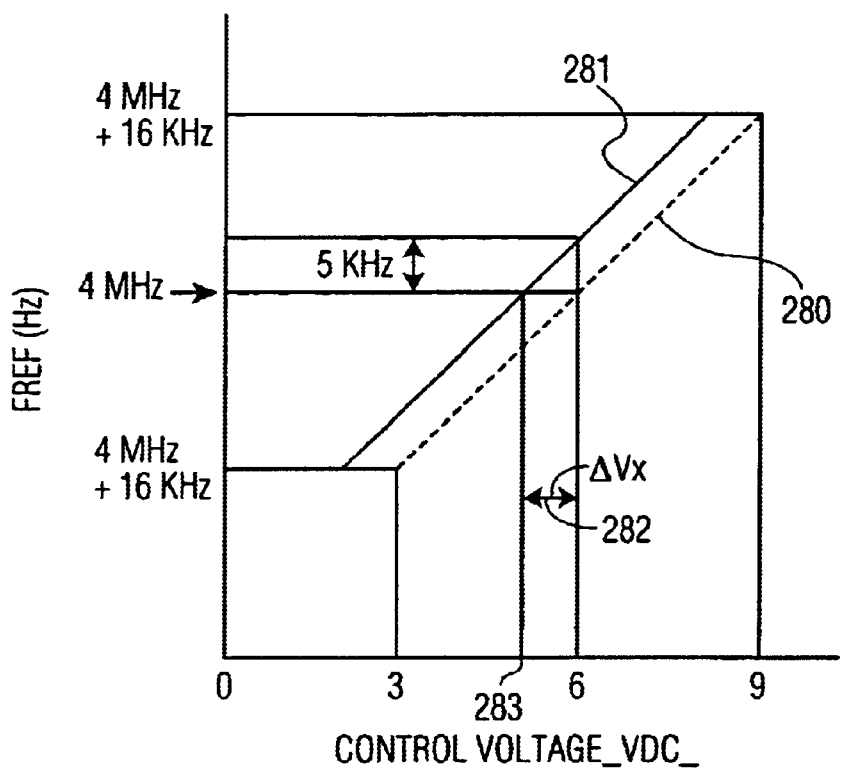
FIG. 10(*a*) is diagram showing the relation between control voltage of a reference oscillator and output frequency in the tuning demodulator for digitally modulated RF signals in embodiment e of the invention.

FIG. 9 and FIG. 10 are a block diagram of a tuning demodulator for digitally modulated RF signals in embodiment 8 of the invention, and its explanatory diagrams respectively, and what differs from embodiment 6 is that a frequency error correction circuit 280 is added. This error correction circuit 230 receives part of an output signal from the reference oscillator 208, and changes the output signal value of the error detection circuit 214 or the counter values of PLL synthesizer 204a on the basis of its output frequency. Broken line 280 in FIG. 10(a) shows the standard characteristic of output frequency of the reference oscillator 208 versus its control voltage, and actually, as shown by solid line 281, the characteristic is often shifted from the standard characteristic due to fluctuations of constituent parts or the like. In FIG. 10(a), the error correction circuit 230 has a function of temporarily changing the output signal value of the error detection circuit 214, issuing, detecting by itself a frequency difference of 6 kHz from the standard characteristic 280 on the basis of the output voltage of the D/A converter 215, that is, the control voltage of the reference oscillator 208 at 6 VDC, and issuing, by offset, the output signal value of the error detection circuit 214 so as to lower the control voltage by the voltage difference portion ΔVx indicated 282 in the diagram, and this circuit effectively realizes the standard characteristic of the broken line 280 equivalently.

Figure 10B:
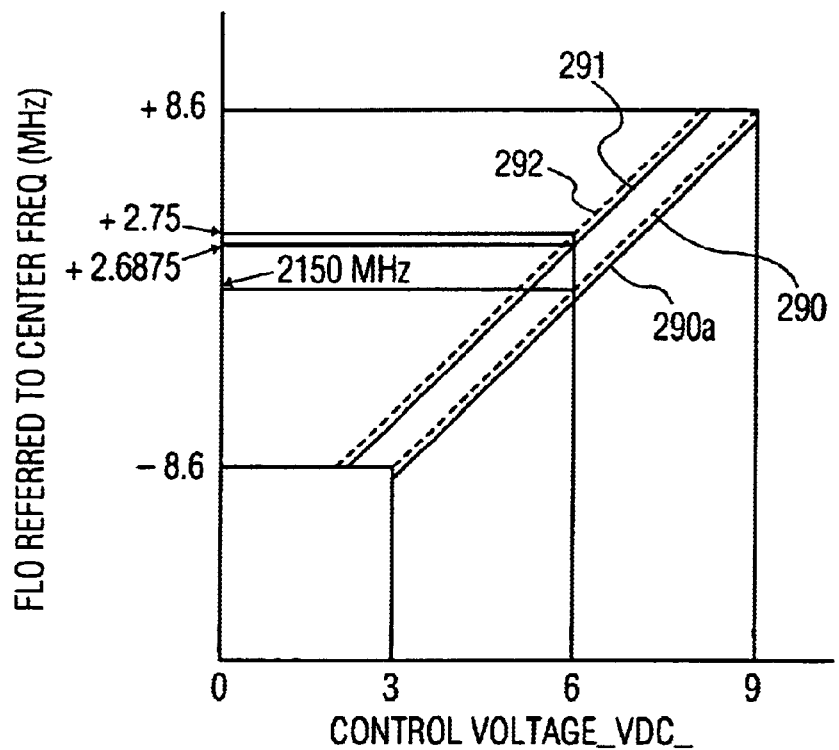
Figure 11:
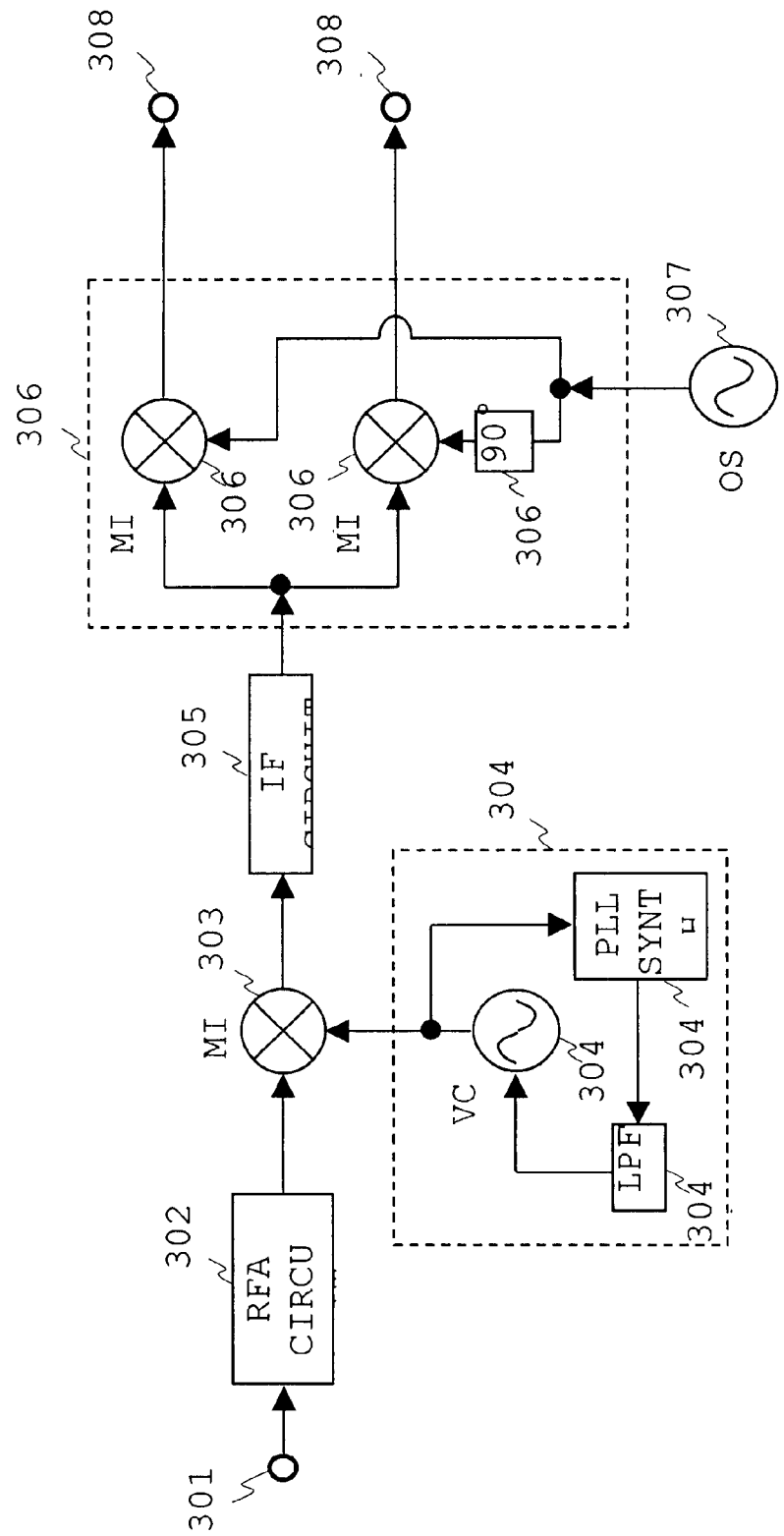
FIG. 11 is a block diagram of a tuning demodulator for digitally modulated RF signals in a prior art

FIG. 10(b) shows the relation between the output frequency $F_{LO}$ of the oscillation circuit 204 and the control voltage, in which broken line 290 and solid line 291 correspond to the characteristics of the reference oscillator 208 which are indicated by broken line 280 and solid line 281 in FIG. 10(a), respectively. The characteristic of the oscillation circuit 204 (which correspond a to a case in which the characteristic of the reference oscillator 208 is offset lower by the portion of Vx and is indicated by solid line 291) may be obtained from the standard characteristic (indicated by broken line 280) of the reference oscillator 208 as the nearly equivalent characteristic indicated by broken line 292 by changing the combination (N,A,R) of the counter values of the PLL synthesizer 204a from (134,24,10) to (134,35,16) by using the error correction circuit 230, instead of controlling by the error detection circuit 214 so as to offset the output voltage of the D/A converter 215, that is, the control voltage of the reference oscillator 206 as mentioned above, and this means that the standard characteristics of the oscillation circuit 204(indicated by broken line 290) can also be obtained substantially as the nearly equivalent characteristic indicated by solid line 290a by changing the combination (N,A,R) of the counter values of the PLL synthesizer 204a by using the error correction circuit 230. Thus, by using the error correction circuit 230, the frequency of the reference oscillation signal can be corrected by using its output signal, and therefore the frequency precision of the reference oscillator is not required to be stricter than in the prior art, and an accurate correction of frequency error is realized. Thus, in the tuning demodulator for digitally modulated RF signals of the invention, as described specifically from FIG. 1 to FIG. 10 relating to preferred embodiments, in the direct detection method in which the digitally modulated RF input signals are not once converted into IF signals, technical problems of suppression of leak of oscillation signal for detection to outside and compensation for frequency error of RF input signal are solved by the above, signal separating means and the above frequency control means of reference oscillation signal, and it contributes to reduction of leak of interference wave, improvement of bit error rate, and enhancement of station selection performance, so that the apparatus may be simplified in structure, reduced in size, and lowered in cost.

What is claimed is:

1. A tuning demodulator for digitally modulated RF signals, comprising;
   (a) an RF input terminal for receiving a digitally modulated RF signal,
   (b) an RF circuit for receiving said RF signal through said RF input terminal,
   (c) an I/Q detection circuit for receiving the output signal of said RF circuit,
   (d) an oscillation circuit for detection for generating an unmodulated RF wave an putting into said I/Q detection circuit,
   (e) a plurality of I/Q output terminals for issuing a detection output signal of said I/Q detection circuit,
   (f) at least one of electrical and mechanical signal separating means for suppressing leakage of the unmodulated RF wave from said RF input terminal, and
   (g) a metallic casing for accommodating (a) to (f),
   wherein as said signal separating means being an arrangement of the circuits (b) to (d), said RF circuit is arranged so that said oscillation circuit is not adjacent thereto, and hence said RF circuit being physically separated from said oscillation circuit, and invasion of radiated signal from said oscillation circuit into said RF circuit is reduced, and
   wherein, as said signal separating means, a plane region of a single-layer printed circuit board is divided into two sections, a print pattern of said RF circuit is formed in the surface of one region, a print pattern of said oscillation circuit for detection is formed on a back side of another region, and a plurality of through-holes are provided for electrically shorting between grounding surface of print pattern of said RF circuit and said oscillation circuit for detection.

2. A tuning demodulator for digitally modulated RF signals of claim 1, wherein said RF circuit, said IQ detection circuit and said oscillation circuit are linearly arranged in this sequence in said metallic casing, and hence invasion of the radiated signal from said oscillation circuit in said RF circuit is further reduced.

3. A tuning demodulator for digitally modulated RF signals of claim 2, wherein said casing having a nearly square plane section, said RF circuit, said I/Q detection circuit, and said oscillation circuit are arranged in this sequence closely along one inner side wall of said metallic casing, and hence invasion of the radiated signal from said oscillation circuit into said RF circuit is further reduced.

4. A tuning demodulator for digitally modulated RF signals of claim 3, wherein each power supply terminal of said RF circuit and said oscillating circuit is provided separately at opposite sides of said metallic casing, and hence invasion of the radiated signal from said power supply terminal for said oscillation circuit into said power supply terminal for said RF circuit is reduced.

5. A tuning demodulator for digitally modulated RF signals of claim 1, wherein a metallic partition board is added to said signal separating means in a configuration such that said metallic partition board is disposed between said RF circuit and said oscillation circuit, so that invasion of the radiated signal from said oscillation circuit into said RF circuit is further reduced.

6. A tuning demodulator for digitally modulated RF signals, comprising:
   (a) an RF input terminal for receiving a digitally modulated RF signal,
   (b) an RF circuit for receiving said RF signal through said RF input terminal,
   (c) an I/Q detection circuit for receiving the output signal of said RF circuit,
   (d) an oscillation circuit for detection for generating an unmodulated RF wave and putting into said I/Q detection circuit,
   (e) a plurality of I/Q output terminals for issuing a detection output signal of said I/Q detection circuit,
   (f) at least one of electrical and mechanical signal separating means for suppressing leakage of the unmodulated RF wave from said RF input terminal, and
   (h) a metallic casing for accommodating (a) to (f),
   wherein said signal separating means being an arrangement of the circuits (b) to (d), said RF circuit is arranged so that said oscillation circuit is not adjacent thereto and hence said RF circuit being physically separated from said oscillation circuit, and invasion of a radiated signal from said oscillation circuit into said RF circuit is reduced, and
   wherein, as said signal separating means, a low pass filter is connected to a power supply terminal for said oscillation circuit to prevent the oscillation signal from leaking to said power supply terminal and radiating from said power supply terminal.

7. A tuning demodulator for digitally modulated RF signals of claim 6, wherein said RF circuit, said IQ detection circuit and said oscillation circuit are linearly arranged in this sequence in said metallic casing, and hence invasion of the radiated signal from said oscillation circuit in said AF circuit is further reduced.

8. A tuning demodulator for digitally modulated RF signals of claim 7, wherein said casing having a nearly square plane section, said RF circuit, said I/Q detection circuit, and said oscillation circuit are arranged in this sequence closely along one inner side wall of said metallic casing, and hence invasion of the radiated signal from said oscillation circuit into said RF circuit is further reduced.

9. A tuning demodulator for digitally modulated RF signals of claim 8, wherein each power supply terminal of said RF circuit and said oscillating circuit is provided separately at opposite sides of said metallic casing, and hence invasion of the radiated signal from said power supply terminal for said oscillation circuit into said power supply terminal for sold RF circuit is reduced.

10. A tuning demodulator for digitally modulated RF signals of claim 6, wherein a metallic partition board is added to said signal separating means in a configuration such that said metallic partition board is disposed between said RF circuit and sold oscillation circuit, so that invasion of the radiated signal from said oscillation circuit into said RF circuit is further reduced.

11. A tuning demodulator for digitally modulated RF signals, comprising:
   (a) an RF input terminal for receiving a digitally modulated RF signal,
   (b) an I/Q detection circuit for receiving said RF signal through said RF input terminal,
   (c) an oscillation circuit for detection for generating an unmodulated RF wave and feeding into said I/Q detection circuit,
   (d) a voltage-controlled reference oscillation signal source for generating a reference oscillation signal for determining the frequency of output signal of said oscillation circuit,
   (e) at least one of electrical and mechanical signal separating means for suppressing leakage of the unmodulated RF wave from said RF input terminal,
   (f) an A/D converter for receiving an output signal of said I/Q detection circuit,
   (g) a complex multiplier for receiving an output signal of said A/D converter,
   (h) a data detection circuit for receiving an output signal of said complex multiplier,
   (i) a plurality of data output terminals for issuing an output signal of said data detection circuit,
   (j) a frequency error detection circuit for detecting a frequency error between said RF signal and the output signal of said oscillation circuit, by using the output signal of said complex multiplier,
   (k) a PLL frequency synthesizer containing a phase lock loop for comparing the phase of both output signals of said oscillation circuit and said voltage-controlled reference oscillation signal source, and controlling the frequency of the output signal of said oscillation circuit in a direction of compensating for said frequency error, and
   (l) a metallic casing for accommodating (a) to (k),
   wherein the frequency of said voltage-controlled reference oscillation signal source is controlled by the output signal value of said frequency error detection circuit.

12. A tuning demodulator for digitally modulated RF signals of claim 11, wherein said voltage controlled reference oscillation signal source is a pulse counter for generating said reference oscillation signal from a clock signal regenerated from the output signal of said complex multiplier and the output signal of said frequency error detection circuit.

13. A tuning demodulator for digitally modulated RF signals, comprising:
   an RF input terminal for receiving a digitally modulated RF signal,
   an J/Q detection circuit for receiving said RF signal through said input terminal,
   an oscillation circuit for detection for generating an unmodulated RF wave and feeding into said I/Q detection circuit,
   a reference oscillation signal source for generating a reference oscillation signal for determining the frequency of output signal of said oscillation circuit for detection,
   signal separating means provided between said RF input terminal and said oscillation circuit for detection,
   an A/D converter for receiving an output signal of said I/Q detection circuit,
   a complex multiplier for receiving an output signal of said A/D converter,
   a data detection circuit for receiving an output signal of said complex multiplier,
   a plurality of data output terminals for issuing an output signal of said data detection, circuit,
   a frequency error detection circuit for detecting a frequency error between said RF signal and the output signal of the oscillation circuit for detection, by using the output signal of said complex multiplier, and
   a PLL frequency synthesizer containing a phase lack loop for comparing the phase of both output signals of said oscillation circuit for detection and reference oscillation signal source, and controlling the frequency of the output signal of the oscillation, circuit for detection in a direction of compensating for said frequency error,
   wherein the frequency of sold reference oscillation signal is controlled by the output signal value of the frequency error detection circuit, and
   wherein if said frequency error exceeds the detectable range of said frequency error detection circuit determined by the method of said digital modulation and the synchronism of sold phase lock loop is not established, the output signal value of said frequency error detection circuit is changed sequentially and issued, and the frequency of the output signal of said oscillation circuit for detection is changed and the synchronism of said phase lock loop is established.

14. A tuning demodulator for digitally modulated RF signals of claim 13, wherein the output signal value of said frequency error detection circuit is changed and issued at every frequency of said AF signal selected by said I/Q detection circuit and said oscillation circuit for detection.

15. A tuning demodulator far digitally modulated RF signals of claim 13, wherein a counter value of said PLL frequency synthesizer is changed if the frequency error exceeds the frequency variable range of the output signal of said oscillation circuit for detection corresponding to the frequency variable range of said reference oscillation signal.

16. A tuning demodulator for digitally modulated RF signals of claim wherein a frequency error correction circuit being connected to said voltage-controlled reference signal source, sold PILL synthesizer and said frequency error detection circuit, said frequency error correction circuit has a function of reading the frequency of sold reference oscillation signal and correcting the frequency of said reference oscillation signal.

17. A tuning demodulator for digitally modulated RF signals of claim 16, wherein the output signal value of said frequency error detection circuit is changed by using the output signal of sold frequency error correction circuit.

18. A tuning demodulator for digitally modulated RF signals comprising:
   (a) an RF input terminal for receiving a digitally modulated RF signal,
   (b) an I/Q detection circuit for receiving said RF signal through said RF input terminal, (c) an oscillation, circuit for detection for generating an unmodulated RF wave and feeding into said I/Q detection circuit, (d) a reference oscillation signal source for generating a reference oscillation signal for determining the frequency of output signal of sold oscillation circuit, (e) at least one of electrical and mechanical signal separating means for suppressing leakage of the unmodulated RF wave from said RF input terminal, (f) an A/D converter for receiving an output signal of said I/Q detection circuit, (g) a complex multiplier for receiving an output signal of said A/D converter, (h) a data detection circuit for receiving an output signal of said complex multiplier, (i) a plurality of data output terminals for issuing an output signal of said data detection circuit, (j) a PLL frequency synthesizer containing a phase lode loop for comparing the phase of both output signals of said oscillation circuit and said reference oscillation signal source, and controlling the frequency of the output signal of said oscillation circuit in a direction of compensating for said frequency error, and (l) a metallic casing far accommodating (a) to (j), wherein a frequency error correction circuit being connected to said reference signal source, said PILL synthesizer, said frequency error correction Circuit has a function of reading the frequency of said reference oscillation signal and correcting the frequency of said oscillation circuit by a counter value combination and a counter value of said PLL frequency synthesizer is changed by using the output signal of said frequency error correction circuit.

* * * * *

UNITED STATES PATENT AND TRADEMARK OFFICE
CERTIFICATE OF CORRECTION

PATENT NO.    : 6,668,025 B1
DATED         : December 23, 2003
INVENTOR(S)   : Sumi et al.

It is certified that error appears in the above-identified patent and that said Letters Patent is hereby corrected as shown below:

Column 13,
Line 35, delete "an", insert -- and --
Line 48, after "invasion of", insert -- a --

Column 14,
Line 41, after "thereto", insert -- , --
Line 54, delete "AF", insert -- RF --

Column 15,
Line 2, delete "sold", insert -- said --
Line 63, delete "J/Q", insert -- I/Q --

Column 16,
Line 21, delete "lack", insert -- lock --
Lines 16 and 42, delete "AF", insert -- RF --
Lines 26, 33, 55 and 61, delete "sold", insert -- said --
Line 44, delete "far", insert -- for --
Line 51, after "claim", insert -- 11, --
Line 53, delete "sold PILL", insert -- said PLL --

UNITED STATES PATENT AND TRADEMARK OFFICE
CERTIFICATE OF CORRECTION

PATENT NO. : 6,668,025 B1
DATED : December 23, 2003
INVENTOR(S) : Sumi et al.

It is certified that error appears in the above-identified patent and that said Letters Patent is hereby corrected as shown below:

Column 18,
Line 1, delete "lode", insert -- lock --
Line 9, delete "PILL", insert -- PLL --
Line 10, delete "Circuit", insert -- circuit --
Line 13, after "circuit by", insert -- setting --.

Signed and Sealed this

First Day of June, 2004

JON W. DUDAS
*Acting Director of the United States Patent and Trademark Office*